United States Patent
Yamamoto

(10) Patent No.: US 8,664,776 B2
(45) Date of Patent: Mar. 4, 2014

(54) INTERCONNECTION TAPE PROVIDING A SERIAL ELECTRODE PAD CONNECTION IN A SEMICONDUCTOR DEVICE

(75) Inventor: Hiroki Yamamoto, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 283 days.

(21) Appl. No.: 13/013,130

(22) Filed: Jan. 25, 2011

(65) Prior Publication Data

US 2011/0187008 A1  Aug. 4, 2011

(30) Foreign Application Priority Data

Jan. 29, 2010 (JP) .................. 2010-017851

(51) Int. Cl.
*H01L 23/48* (2006.01)

(52) U.S. Cl.
USPC .... 257/786; 257/666; 257/773; 257/E21.151; 438/107; 438/111; 438/118; 438/125

(58) Field of Classification Search
USPC .......... 257/666, 676, 773, 786, E21.151; 438/107, 111–112, 118–119, 125
See application file for complete search history.

(56) References Cited

U.S. PATENT DOCUMENTS

| | | | |
|---|---|---|---|
| 5,815,173 A * | 9/1998 | Silverbrook | 347/15 |
| 2005/0168961 A1* | 8/2005 | Ono et al. | 361/784 |
| 2005/0280034 A1* | 12/2005 | Hosoyamada et al. | 257/207 |

FOREIGN PATENT DOCUMENTS

| | | |
|---|---|---|
| JP | 5-21694 A | 1/1993 |
| JP | 8-288323 A | 11/1996 |
| JP | 11-307591 A | 11/1999 |
| JP | 2000-77559 A | 3/2000 |

* cited by examiner

*Primary Examiner* — Mark A Laurenzi
(74) *Attorney, Agent, or Firm* — Foley & Lardner LLP

(57) ABSTRACT

A semiconductor device has a semiconductor chip and a first interconnection tape. The semiconductor chip has a plurality of first electrode pads arranged on a first surface. The first interconnection tape is in contact with each of the plurality of first electrode pads such that the plurality of first electrode pads are electrically connected with each other.

6 Claims, 3 Drawing Sheets

INTERCONNECTION TAPE PROVIDING A SERIAL ELECTRODE PAD CONNECTION IN A SEMICONDUCTOR DEVICE

INCORPORATION BY REFERENCE

This application is based upon and claims the benefit of priority from Japanese patent application No. 2010-017851, filed on Jan. 29, 2010, the disclosure of which is incorporated herein in its entirety by reference.

BACKGROUND OF THE INVENTION

1. Field of the Invention

The present invention relates to a semiconductor device and a method of manufacturing a semiconductor device.

2. Description of Related Art

In recent years, digital electronic devices such as digital televisions and digital cameras are spreading fast, and their performances and functions are increasing. Since reduction in size, thickness, weight and power consumption is highly required for the digital electronic device, reduction in size and power consumption and increase in the number of pins are increasing with regard to a semiconductor device used in the digital electronic device. Since such the devices have a lot of product lineups and are frequently remodeled, it is important to reduce costs as much as possible from the start of development. To reduce in size is not only an effective method for reducing costs but also meets the above-mentioned requirement for the digital electronic devices. However, when a semiconductor device is miniaturized, it becomes difficult to ensure a sufficient number of signal terminals.

Japanese Patent Publication JP-H05-021694 (Patent Literature 1) discloses a semiconductor device in which the number of power-supply leads is decreased and thereby a size of a package body can be reduced. Specifically, the semiconductor device has: a semiconductor chip having a lot of electrodes; a plurality of leads connected to the electrodes through wires and drawn out of the device; a conductive plate formed on the semiconductor chip through an insulation material and connected to the electrodes through wires; and a package body resin-encapsulating them. In the semiconductor device, a power-supply lead and a ground lead that can have a large cross-sectional area are formed above the semiconductor chip. Therefore, inductance of the power-supply line of the semiconductor device can be lowered and thereby electrical characteristics can be improved. As a result, the number of power-supply leads drawn out of the package body can be reduced and thus the size of the semiconductor device can be reduced.

Japanese Patent Publication JP-2000-77559 (Patent Literature 2) discloses a semiconductor device that has excellent electrical characteristics such as high-frequency characteristics. Specifically, the semiconductor device has: a film-shaped insulating substrate having a device hole; inner leads so formed as to stick out to the device hole; a semiconductor element placed within the device hole and connected to the inner leads; and an encapsulation resin layer that covers connection regions of the semiconductor element. The semiconductor device further has a power-supply or ground interconnect section that is ring-shaped and arranged in the device hole region inside of the inner leads. Moreover, power-supply or ground connection pads are arranged in a region outside of the encapsulation resin layer and are connected to the interconnect section through drawing interconnections. In the semiconductor device, it is possible to connect with an extremely short length between a power-supply or ground electrode terminal of the semiconductor element and the power-supply or ground connection pad through the power-supply or ground interconnect section.

Japanese Patent Publication JP-H08-288323 (Patent Literature 3) discloses a TAB (Tape Automated Bonding) semiconductor device. In the semiconductor device, both of front and back surfaces of a semiconductor chip and a lead frame are encapsulated with insulating films, and only a part of one surface of the lead frame is exposed on the outside of the insulating film. In the semiconductor device, circumference of the semiconductor chip can be easily encapsulated to include one surface of the lead frame. It is therefore possible to simplify a manufacturing process.

[Patent Literature]

[Patent Literature 1] Japanese Patent Publication JP-H05-021694

[Patent Literature 2] Japanese Patent Publication JP-2000-77559

[Patent Literature 3] Japanese Patent Publication JP-H08-288323

SUMMARY

The inventor of the present application has recognized the following points. When a semiconductor device is miniaturized for reducing costs, power-supply terminals and ground terminals of a semiconductor package are main targets of reduction in order that the miniaturized semiconductor device can have signal terminals as much as possible. However, if the power-supply terminals and the ground terminals are reduced too much, IR drop (I: current, R: interconnect resistance) namely voltage drop is caused, which results in a problem that malfunction of the semiconductor device is likely to occur.

In an aspect of the present invention, a semiconductor device is provided. The semiconductor device has: a plurality of first electrode pads arranged on a first surface; and a first interconnection tape being in contact with each of the plurality of first electrode pads such that the plurality of first electrode pads are electrically connected with each other.

In another aspect of the present invention, a method of manufacturing a semiconductor device is provided. The method includes: bringing a first interconnection tape into contact with each of a plurality of first electrode pads arranged on a first surface of a semiconductor chip, such that the plurality of first electrode pads are electrically connected with each other; and electrically connecting a first package terminal for use in external connection and the first interconnection tape through a first connection section.

The semiconductor device according to the present invention can be provided with more signal terminals and less power-supply terminals and ground terminals.

BRIEF DESCRIPTION OF THE DRAWINGS

The above and other objects, advantages and features of the present invention will be more apparent from the following description of certain preferred embodiments taken in conjunction with the accompanying drawings, in which.

DESCRIPTION OF PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

(First Embodiment)

Figure 1:
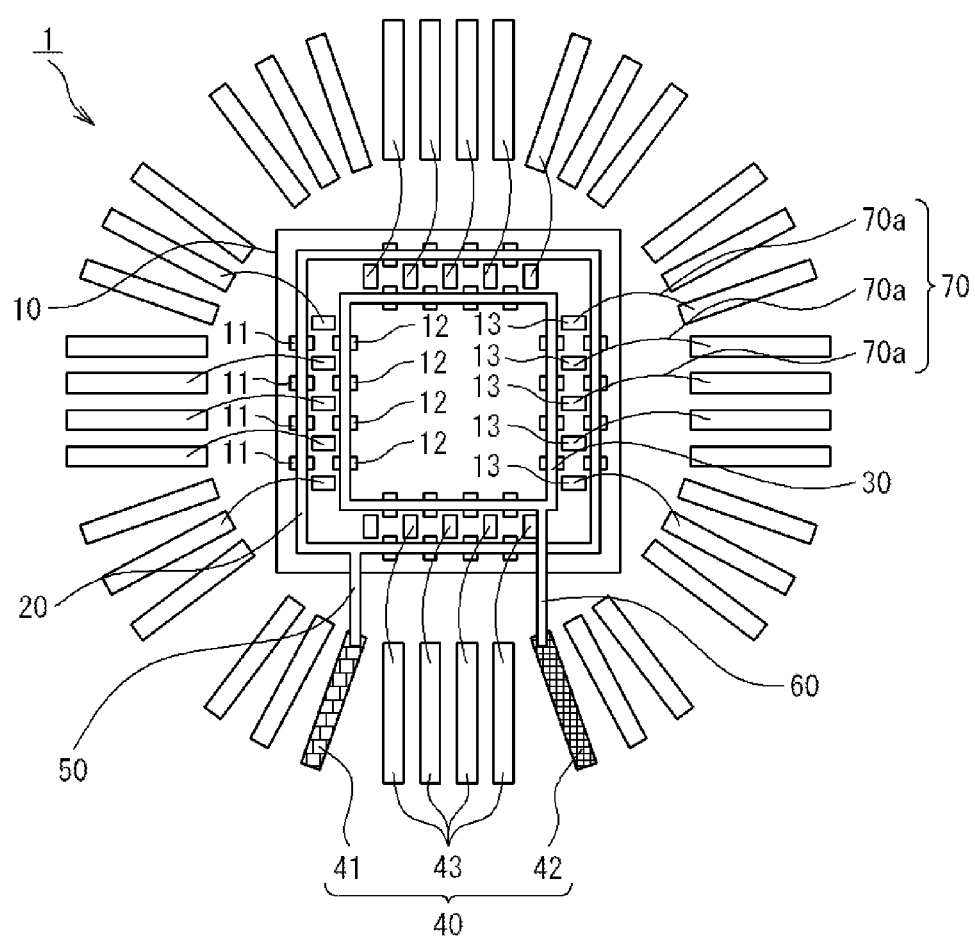
FIG. 1 is a plan view showing a semiconductor device according to a first embodiment of the present invention.

A semiconductor device 1 according to a first embodiment of the present invention will be described. FIG. 1 is a plan view showing the semiconductor device 1 according to the first embodiment of the present invention. As shown in FIG. 1, the semiconductor device 1 has a semiconductor chip 10, an interconnection tape 20, an interconnection tape 30, a package terminal section 40, a connection lead 50, a connection lead 60 and a wire section 70. It should be noted that the semiconductor device 1 according to the present embodiment is resin-encapsulated except for an outer end of the package terminal section 40 in order to protect the semiconductor chip 10 and the like, the description of the encapsulation resin is omitted in FIG. 1.

The semiconductor chip 10, which includes circuits for achieving various functions, is provided with a plurality of electrode pads that are connected to the circuits and arranged in a circumference section on a surface of the chip. More specifically, the semiconductor chip 10 is provided with a plurality of GND pads 11, a plurality of VDD pads 12 and a plurality of signal pads 13. The plurality of GND pads 11 and the plurality of VDD pads 12 are electrode pads to which power is supplied. The plurality of signal pads 13 are electrode pads to which signals are input and from which signals are output. When viewed from above, the plurality of GND pads 11, the plurality of VDD pads 12 and the plurality of signal pads 13 are aligned in parallel with each other in the vicinity of each of four sides of the semiconductor chip 10. In other words, the plurality of GND pads 11, the plurality of VDD pads 12 and the plurality of signal pads 13 are arranged in three straight lines parallel to a side of outer circumference of the semiconductor chip 10.

The interconnection tape 20 is arranged over the semiconductor chip 10 and is in contact with each of the plurality of GND pads 11. Specifically, the interconnection tape 20 has a ring-shape and electrically connects the plurality of GND pads 11 with each other. It should be noted that the "ring-shape" means "closed-loop shape" comprising straight lines and/or curved lines. That is, the interconnection tape 20 is arranged in a closed-loop shape on the surface of the semiconductor chip 10. The interconnection tape 20 has an interconnection pattern formed of copper foil and the like on one side of a resin film. In other words, the interconnection tape 20 has: an interconnection pattern (conductive layer) formed of copper foil and the like and being in contact with each of the plurality of GND pads 11; and a resin film (insulating layer) formed to cover a surface of the interconnection pattern and located at a surface of the interconnection tape 20. Since the interconnection tape 20 is in contact with the plurality of GND pads 11 so as to cover the plurality of GND pads 11, the interconnection pattern of the interconnection tape 20 is in planar contact with each of the plurality of GND pads 11 and thus electrical connection can be surely achieved. A cross-section at the contact position has a lamination structure of the GND pad 11 of the semiconductor chip 10, the interconnection pattern of the interconnection tape 20 and the resin film of the interconnection tape 20. It should be noted the plurality of VDD pads 12 and the plurality of signal pads 13 are arranged on the surface of the semiconductor chip 10 surrounded by the interconnection tape 20.

Similarly to the interconnection tape 20, the interconnection tape 30 is arranged over the semiconductor chip 10 and is in contact with each of the plurality of VDD pads 12. Specifically, the interconnection tape 30 has a ring-shape and electrically connects the plurality of VDD pads 12 with each other. The interconnection tape 30 has an interconnection pattern formed of copper foil and the like on one side of a resin film. Therefore, a cross-section at the contact position has a lamination structure of the VDD pad 12 of the semiconductor chip 10, the interconnection pattern (conductive layer) of the interconnection tape 30 and the resin film (insulating layer) of the interconnection tape 30. The interconnection tape 20 and the interconnection tape 30 are so arranged as not to overlap with each other over the surface of the semiconductor chip 10. It should be noted that the plurality of GND pads 11 and the plurality of signal pads 13 are arranged on the surface of the semiconductor chip 10 located outside of the interconnection tape 30. In particular, the plurality of signal pads 13 are arranged in a region sandwiched by the interconnection tape 20 and the The package terminal section 40 includes package terminals for use in external connection of the semiconductor device 1. The package terminals are located outside of the semiconductor chip 10 and so arranged in a radial fashion as to surround the semiconductor chip 10. More specifically, the package terminal section 40 includes a GND package terminal 41, a VDD package terminal 42 and a signal package terminal 43. Different voltages as power-supply are respectively supplied to the GND package terminal 41 and the VDD package terminal 42. The GND package terminal 41 is a package terminal to which a ground voltage is supplied, while the VDD package terminal 42 is a package terminal to which a power-supply voltage is supplied. The signal package terminal 43 is a package terminal to which a signal is input and from which a signal is output. It should be noted that positions and the numbers of the GND package terminals 41, the VDD package terminal 42 and the signal package terminal 43 are not limited to those shown FIG. 1. However, it is preferable that the GND package terminal 41 is positioned such that the connection lead 50 becomes as short as possible and the VDD package terminal 42 is positioned such that the connection lead 60 becomes as short as possible. It is also preferable that the numbers of the GND package terminals 41 and the VDD package terminals 42 are as small as possible such that the semiconductor device 1 can be provided with more signal package terminals 43.

The connection lead 50 (connection section) electrically connects between the interconnection tape 20 and the GND package terminal 41. As in the case of the interconnection tape 20, the connection lead 50 has an interconnection pattern formed of copper foil and the like on one side of a resin film. In other words, the connection lead 50 has: an interconnection pattern (conductive layer) electrically connecting between the interconnection tape 20 and the GND package terminal 41; and a resin film (insulating layer) formed to cover a surface of the interconnection pattern and located at a surface of the connection lead 50.

The connection lead 60 (connection section) electrically connects between the interconnection tape 30 and the VDD package terminal 42. As in the case of the connection lead 50, the connection lead 60 has an interconnection pattern formed of copper foil and the like on one side of a resin film. In other words, the connection lead 60 has: an interconnection pattern (conductive layer) electrically connecting between the interconnection tape 30 and the VDD package terminal 42; and a resin film (insulating layer) formed to cover a surface of the interconnection pattern and located at a surface of the connection lead 60. Although the connection lead 60 is in contact with the interconnection tape 20, the connection lead 60 can intersect with the interconnection tape 20 without short-circuiting, because the surface of the interconnection tape 20 is the insulating resin film. That is, a cross-section at the intersection has a lamination structure of the semiconductor chip 10, the interconnection pattern of the interconnection tape 20, the resin film of the interconnection tape 20, the interconnection pattern of the connection lead 60 and the resin film of the connection lead 60. It should be noted that the vertical positional relationship between the interconnection tape 20 and the connection lead 60 may be inversed. In this manner, the interconnection tape 20 and the connection lead 60 can intersect with each other, which makes it easier to ensure a space for forming the wire section 70. It should be noted that the connection lead 50 and the connection lead 60 each is thicker than one wire 70a, which enables secure power-supply.

The wire section 70 electrically connects between the semiconductor chip 10 and the package terminal section 40. Specifically, the wire section 70 includes a plurality of wires 70a. One wire 70a electrically connects between one signal pad 13 and one signal package terminal 43 associated with the one signal pad 13.

According to the semiconductor device 1 thus constructed, the power supplied through the GND package terminal 41 and the VDD package terminal 42 can be supplied to the plurality of GND pads 11 and the plurality of VDD pads 12 through the ring-shaped interconnection tape 20 and the ring-shaped interconnection tape 30, respectively. That is to say, according to the semiconductor device 1 in the present embodiment, it is possible to supply sufficient power even with smaller numbers of the GND package terminals 41 and the VDD package terminals 42. In particular, when the interconnection tape 20 and the interconnection tape 30 each has the ring-shape, the voltage drop can be suppressed and thus the power-supply voltage and the ground voltage can be stabilized, which is preferable.

Figure 2:
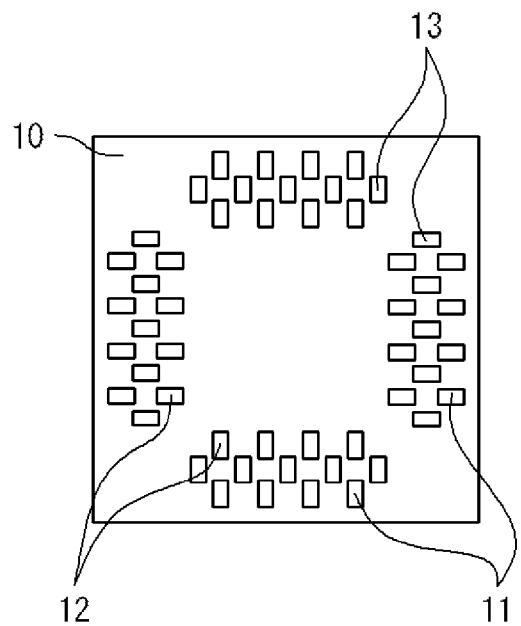
FIG. 2 is a plan view showing a semiconductor chip according to the first embodiment of the present invention.

Next, a method of manufacturing the semiconductor device 1 according to the first embodiment of the present invention will be described. FIG. 2 is a plan view showing a surface of the semiconductor chip 10. As shown in FIG. 2, the plurality of GND pads 11, the plurality of VDD pads 12 and the plurality of signal pads 13 are formed on the surface of the semiconductor chip 10. When viewed from above, the plurality of GND pads 11, the plurality of VDD pads 12 and the plurality of signal pads 13 are aligned in parallel with each other in the vicinity of each of four sides of the semiconductor chip 10.

Figure 3:
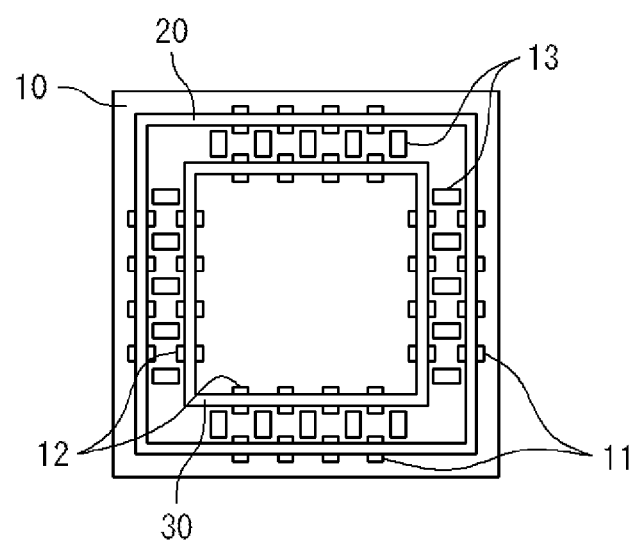
FIG. 3 is a plan view showing a situation where interconnection tapes are brought into contact with the semiconductor chip.

FIG. 3 is a plan view showing a situation where the interconnection tape 20 and the interconnection tape 30 are brought into contact with the semiconductor chip 10 shown in FIG. 2. As shown in FIG. 3, the interconnection tape 20 is arranged in a ring shape on the surface of the semiconductor chip 10 and brought into contact with each of the plurality of GND pads 11 such that the plurality of GND pads 11 are electrically connected with each other. Moreover, the interconnection tape 30 is arranged in a ring shape on the surface of the semiconductor chip 10 and brought into contact with each of the plurality of VDD pads 12 surrounded by the interconnection tape 20 such that the plurality of VDD pads 12 are electrically connected with each other. It should be noted that a formation order of the interconnection tape 20 and the interconnection tape 30 is arbitrary.

The semiconductor chip 10 with which the interconnection tape 20 and the interconnection tape 30 are in contact is connected to the package terminal section 40. More specifically, as shown in FIG. 1, the interconnection tape 20 and the GND package terminal 41 are electrically connected with each other through the connection lead 50. Moreover, the interconnection tape 30 and the VDD package terminal 42 are electrically connected with each other through the connection lead 60. Furthermore, the signal package terminal 43 is electrically connected to the signal pad 13 through the wire 70a. In this manner, the semiconductor device 1 according to the first embodiment of the present invention is manufactured.

In the semiconductor device 1 according to the first embodiment of the present invention, the power supplied through the GND package terminal 41 and the VDD package terminal 42 can be supplied to the plurality of GND pads 11 and the plurality of VDD pads 12 through the ring-shaped interconnection tape 20 and the ring-shaped interconnection tape 30, respectively. That is to say, according to the semiconductor device 1 in the present embodiment, it is possible to supply sufficient power even with smaller numbers of the GND package terminals 41 and the VDD package terminals 42. In particular, when the interconnection tape 20 and the interconnection tape 30 each has the ring-shape, the voltage drop can be suppressed and thus the power-supply voltage and the ground voltage can be stabilized. Therefore, the semiconductor device 1, even miniaturized, can be provided with more signal terminals 13. It should be noted that the interconnection tape 20 and the interconnection tape 30 in the present embodiment form a double ring shape. However, the structure is not limited to the double ring shape.

(Second Embodiment)

Figure 4:
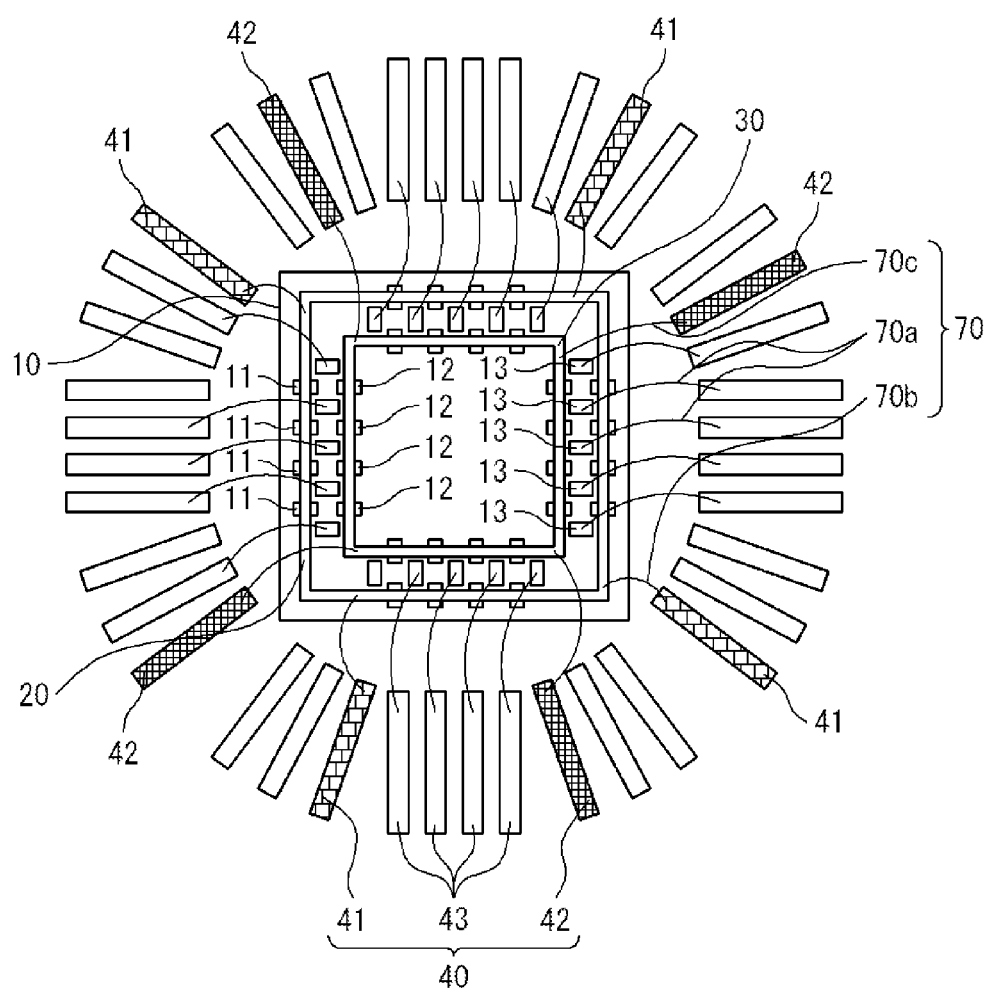
FIG. 4 is a plan view showing a semiconductor device according to a second embodiment of the present invention.

The semiconductor device 1 according to a second embodiment of the present invention will be described. The semiconductor device 1 according to the second embodiment of the present invention is obtained by replacing the connection leads 50 and 60 in the first embodiment with wires. FIG. 4 is a plan view showing the semiconductor device 1 according to the second embodiment of the present invention. As shown in FIG. 4, the semiconductor device 1 has the semiconductor chip 10, the interconnection tape 20, the interconnection tape 30, the package terminal section 40 and the wire section 70. Note that the same reference numerals are given to similar components to those described in the first embodiment, and an overlapping description will be omitted as appropriate.

The wire section 70 electrically connects between the semiconductor chip 10 and the package terminal section 40. More specifically, the wire section 70 includes a plurality of wires 70a, a plurality of wires 70b and a plurality of wires 70c. One wire 70a electrically connects between one signal pad 13 and one signal package terminal 43 associated with the one signal pad 13. One wire 70b electrically connects between an arbitrary portion of the interconnection tape 20 and one GND package terminal 41. One wire 70c electrically connects between an arbitrary portion of the interconnection tape 30 and one VDD package terminal 42. It is preferable that a wire length of each of the plurality of wires 70a is as small as possible. It is preferable that a wire length of each of the plurality of wires 70b is as small as possible. It is preferable that a wire length of each of the plurality of wires 70c is as small as possible.

The package terminal section 40 according to the second embodiment of the present invention includes a plurality of GND package terminals 41 and a plurality of VDD package terminals 42. The interconnection tape 20 is electrically connected to the plurality of GND package terminals 41 through the plurality of wires 70b. The interconnection tape 30 is electrically connected to the plurality of VDD package terminals 42 through the plurality of wires 70c. It should be noted that positions and the numbers of the GND package terminals 41, the VDD package terminal 42 and the signal package terminal 43 are not limited to those shown FIG. 4. However, it is preferable that the GND package terminal 41 is positioned such that the wire 70b becomes as short as possible and the VDD package terminal 42 is positioned such that the wire 70c becomes as short as possible. It is also preferable that the numbers of the GND package terminals 41 and the VDD package terminals 42 are as small as possible such that the semiconductor device 1 can be provided with more signal package terminals 43.

Next, a method of manufacturing the semiconductor device 1 according to the second embodiment of the present invention will be described. The method of manufacturing the semiconductor device 1 according to the second embodiment of the present invention is the same as in the case of the first embodiment until the manufacturing process shown in FIG. 3. Therefore, a manufacturing process after FIG. 3 will be described below.

As shown in FIG. 3, the interconnection tape 20 and the interconnection tape 30 are in contact with the semiconductor chip 10. After that, the semiconductor chip 10 is connected to the package terminal section 40 by wire bonding process. As shown in FIG. 4, the wire section 70 electrically connects between the semiconductor chip 10 and the package terminal section 40. More specifically, one wire 70a electrically connects between one signal pad 13 and one signal package terminal 43 associated with the one signal pad 13. One wire 70b electrically connects between an arbitrary portion of the interconnection tape 20 and one GND package terminal 41. One wire 70c electrically connects between an arbitrary portion of the interconnection tape 30 and one VDD package terminal 42. With regard to each of the interconnection tapes 20 and 30, electrical connection is possible at any position on the tape by the wire bonding. In this manner, the semiconductor device 1 according to the second embodiment of the present invention is manufactured.

According to the second embodiment of the present invention, the same effects as in the case of the first embodiment can be obtained. Furthermore, according to the semiconductor device 1 of the second embodiment, it is possible to connect the wires to arbitrary positions on the interconnection tape 20 and the interconnection tape 30. Therefore, design flexibility of the semiconductor device 1 can be improved.

According to the semiconductor device 1 of the above-described embodiments of the present invention, the ring-shaped interconnection tape is in contact with the plurality of electrode pads on the semiconductor chip 10 and thus the ground voltage or the power-supply voltage can be shared by the plurality of electrode pads. Consequently, the semiconductor device 1 can be provided with more signal terminals and less power-supply terminals and ground terminals. In particular, when the interconnection tape has the ring-shape, the power-supply voltage or the ground voltage can be stabilized even with a small number of the power-supply terminals or the ground terminals. Moreover, according to the semiconductor device 1 of the above-described embodiments, the wire bonding is performed with respect to only a part of the electrode pads. Therefore, the number and use amount of wires can be reduced. When the number and use amount of wires are reduced, short-circuit between wires can be suppressed, which leads to reduction in costs and improvement of reliability and yield. Furthermore, according to the semiconductor device 1 of the above-described embodiments, it is also possible to reduce power-supply terminals and ground terminals on a mother board on which the semiconductor device 1 is mounted. Therefore, it becomes easier to design the mother board. It should be noted that the above-described embodiments can be combined as long as no contradiction arises.

It is apparent that the present invention is not limited to the above embodiments and may be modified and changed without departing from the scope and spirit of the invention.

What is claimed is:

1. A semiconductor device comprising:
    a semiconductor chip comprising a plurality of first electrode pads arranged on a first surface and a plurality of second electrode pads arranged on said first surface;
    a first interconnection tape being in contact with each of said plurality of first electrode pads such that said plurality of first electrode pads are electrically connected with each other,
    wherein said first interconnection tape is arranged in a closed-loop shape on said first surface;
    a second interconnection tape in contact with each of said plurality of second electrode pads such that said plurality of second electrode pads are electrically connected with each other,
    wherein said second electrode pads are further surrounded by said first interconnection tape.

2. The semiconductor device according to claim 1,
    wherein second interconnection tape is arranged in a closed-loop shape on said first surface.

3. The semiconductor device according to claim 1,
    wherein said first interconnection tape comprises: a first conductive layer being in contact with each of said plurality of first electrode pads; and
    a first insulating layer formed to cover a surface of said first conductive layer,
    wherein said second interconnection tape comprises:
        a second conductive layer being in contact with each of said plurality of second electrode pads; and
        a second insulating layer formed to cover a surface of said second conductive layer.

4. The semiconductor device according to claim 1, further comprising:
    a first package terminal for use in external connection;
    a second package terminal for use in external connection;
    a first connection section electrically connecting between said first interconnection tape and said first package terminal; and
    a second connection section electrically connecting between said second interconnection tape and said second package terminal.

5. The semiconductor device according to claim 4,
    wherein said first connection section comprises:
        a third conductive layer electrically connecting between said first interconnection tape and said first package terminal; and
        a third insulating layer formed to cover a surface of said third conductive layer,
    wherein said second connection section comprises:
        a fourth conductive layer electrically connecting between said second interconnection tape and said second package terminal; and
        a fourth insulating layer formed to cover a surface of said fourth conductive layer.

6. The semiconductor device according to claim 4,
    wherein different voltages are respectively supplied to said first package terminal and said second package terminal.

* * * * *